(12) United States Patent  
Shih et al.

(10) Patent No.: US 9,419,010 B2  
(45) Date of Patent: Aug. 16, 2016

(54) HIGH ASPECT RATIO ETCHING METHOD

(71) Applicant: MACRONIX INTERNATIONAL CO., LTD., Hsinchu (TW)

(72) Inventors: Yen-Hao Shih, Elmsford, NY (US); Chih-Ping Chen, Tainan (TW); Sheng-Chih Lai, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 124 days.

(21) Appl. No.: 14/488,937

(22) Filed: Sep. 17, 2014

(65) Prior Publication Data

US 2015/0243674 A1     Aug. 27, 2015

Related U.S. Application Data

(60) Provisional application No. 61/944,021, filed on Feb. 24, 2014, provisional application No. 62/016,412, filed on Jun. 24, 2014.

(51) Int. Cl.
| | |
|---|---|
| *H01L 27/115* | (2006.01) |
| *H01L 21/311* | (2006.01) |
| *H01L 21/3213* | (2006.01) |
| *H01L 21/768* | (2006.01) |

(52) U.S. Cl.
CPC .... *H01L 27/11582* (2013.01); *H01L 21/31111* (2013.01); *H01L 21/32133* (2013.01); *H01L 21/768* (2013.01); *H01L 27/11556* (2013.01)

(58) Field of Classification Search
CPC ................... H01L 21/31122; H01L 21/76802; H01L 21/31144
USPC ........................................................ 438/268
See application file for complete search history.

(56) References Cited

U.S. PATENT DOCUMENTS

| | | | |
|---|---|---|---|
| 8,148,763 B2* | 4/2012 | Kim et al. ...................... 257/296 |
| 8,208,279 B2* | 6/2012 | Lue ................................. 365/63 |
| 8,363,476 B2 | 1/2013 | Lue et al. | |
| 2012/0043673 A1* | 2/2012 | Chang et al. ................... 257/786 |
| 2012/0068241 A1 | 3/2012 | Sakuma et al. | |
| 2012/0185753 A1* | 7/2012 | Chen et al. ..................... 714/773 |
| 2012/0319172 A1* | 12/2012 | Ramaswamy et al. ......... 257/204 |
| 2012/0327714 A1* | 12/2012 | Lue ........................... 365/185.17 |

\* cited by examiner

*Primary Examiner* — Mohammad Islam  
*Assistant Examiner* — Christina Sylvia  
(74) *Attorney, Agent, or Firm* — Yiding Wu; Haynes Beffel & Wolfeld LLP

(57) ABSTRACT

A plurality of semiconductor layers is etched to define a first plurality of stacks of active strips between a first plurality of trenches. A first memory layer is formed on side surfaces of active strips in the first plurality of trenches, and a first layer of conductive material is formed over the first memory layer. The first plurality of stacks is etched to define a second plurality of stacks of active strips between a second plurality of trenches of the plurality of semiconductor layers. A second memory layer is formed on side surfaces of active strips in the second plurality of trenches, and a second layer of conductive material is formed over the second memory layer. Channel regions of memory cells in the memory device are formed in active strips of the plurality of semiconductor layers in the second plurality of stacks.

16 Claims, 15 Drawing Sheets

HIGH ASPECT RATIO ETCHING METHOD

REFERENCE TO RELATED APPLICATION

This application claims benefit of U.S. Provisional Patent Application No. 61/944,021 filed on 24 Feb. 2014, and U.S. Provisional Patent Application No. 62/016,412 filed on 24 Jun. 2014. Both provisional patent applications are incorporated by reference as if fully set forth herein.

BACKGROUND

1. Field of the Invention

The present invention relates to three-dimensional (3D) memory devices, and more particularly to methods to fabricate such memory devices.

2. Description of Related Art

High density memory devices are being designed that comprise arrays of flash memory cells, or other types of memory cells. In some examples, the memory cells comprise thin film transistors which can be arranged in 3D architectures.

In one example, a 3D memory device includes a plurality of stacks of poly crystalline active strips separated by insulating material. The active strips can act as bit lines or word lines. The 3D memory device can include a plurality of word lines structures arranged orthogonally over the plurality of stacks of active strips which act as bit lines. Alternatively, the 3D memory device can include a plurality of bit line structures arranged orthogonally over the plurality of stacks of active strips which act as word lines. Memory cells including charge storage structures are formed at cross-points between side surfaces of the active strips in the plurality of stacks and the word lines structures or bit line structures. Channel regions of memory cells are formed in the active material strips. 3D memory devices using small dimension memory cells, including vertical gate (VG) 3D NAND memory devices, can present challenges in manufacturing such memory devices as stacks in the memory devices include more layers of memory cells.

It is desirable to improve methods in manufacturing such memory devices.

SUMMARY

The present invention provides a method for manufacturing a memory device. A plurality of semiconductor layers alternating with insulating layers is formed on an integrated circuit substrate. The plurality of semiconductor layers is etched to define a first plurality of stacks of active strips between a first plurality of trenches, where a stack in the first plurality of stacks has a width greater than two times a target width.

A target width as used in the present specification refers to an average width of active strips in stacks of active strips that can act as bit lines in the memory device. The target width can be substantially equal to a critical dimension referred to as '1F' in the art of semiconductor manufacturing technologies. "Substantially equal to" as used in the present specification means within manufacturing tolerances of semiconductor manufacturing technology as understood by one of ordinary skill in the art. For instance, the critical dimension can have a range of average values from 26 nm to 33 nm between active strips near the top of the stacks and near the bottom of the stacks. Memory layers are formed in trenches between adjacent stacks, and conductive lines that can act as word lines are defined over the memory layers. In the present specification, a width of the trench is also referred to as '1F', although a range of average values of the width of the trenches near the top of the stacks and near the bottom of the stacks can be different than the range of average values for the critical dimension of the active strips. A combined width of a trench and an adjacent stack in the resultant memory device can be referred to as '2F'.

After the first plurality of stacks is defined, a first memory layer is formed on side surfaces of active strips in the first plurality of stacks in the first plurality of trenches, and a first layer of conductive material is formed over and having a surface conformal with the first memory layer.

After the first memory layer and the first layer of conductive material are formed in the first plurality of trenches, the first plurality of stacks is etched to divide each stack in the first plurality of stacks into two stacks in a second plurality of stacks of active strips of the plurality of semiconductor layers. Each stack in the second plurality of stacks is defined between a first trench in the first plurality of trenches and a second trench in a second plurality of trenches. A stack in the second plurality of stacks has a width substantially equal to the target width. Channel regions of memory cells in the memory device are formed in active strips of the plurality of semiconductor layers in the second plurality of stacks.

After the second plurality of stacks is defined between the second plurality of trenches, a second memory layer is formed on side surfaces of active strips in the second plurality of stacks in the second plurality of trenches, and a second layer of conductive material is formed over and having a surface conformal with the second memory layer.

After the second memory layer is formed on side surfaces of active strips in the second plurality of stacks in the second plurality of trenches, and the second layer of conductive material is formed over and having a surface conformal with the second memory layer, the first layer of conductive material is etched to define a first plurality of conductive lines in the first plurality of trenches. Conductive lines in the plurality of conductive lines in the first plurality of trenches are arranged orthogonally over, and having surfaces conformal with, the first memory layer, defining memory cells in interface regions at cross-points between side surfaces of the active strips in the first plurality of stacks and the first plurality of conductive lines in the first plurality of trenches.

After the plurality of conductive lines is defined in the first plurality of trenches, the second layer of conductive material is etched to define a second plurality of conductive lines in the second plurality of trenches. Conductive lines in the plurality of conductive lines in the second plurality of trenches are arranged orthogonally over, and having surfaces conformal with, the second memory layer, defining memory cells in interface regions at cross-points between side surfaces of the active strips in the second plurality of the stacks and the second plurality of conductive lines in the second plurality of trenches.

Horizontal conductive lines can be formed connecting a first plurality of conductive lines in the first plurality of trenches and a second plurality of conductive lines in the second plurality of trenches to a row decoder in the memory device. Bit line structures can be formed connecting active strips in the second plurality of stacks of active strips to a column decoder in the memory device.

A memory device substantially as described herein is also provided.

Other aspects and advantages of the present invention can be seen on review of the drawings, the detailed description and the claims, which follow.

DETAILED DESCRIPTION

Figure 1:
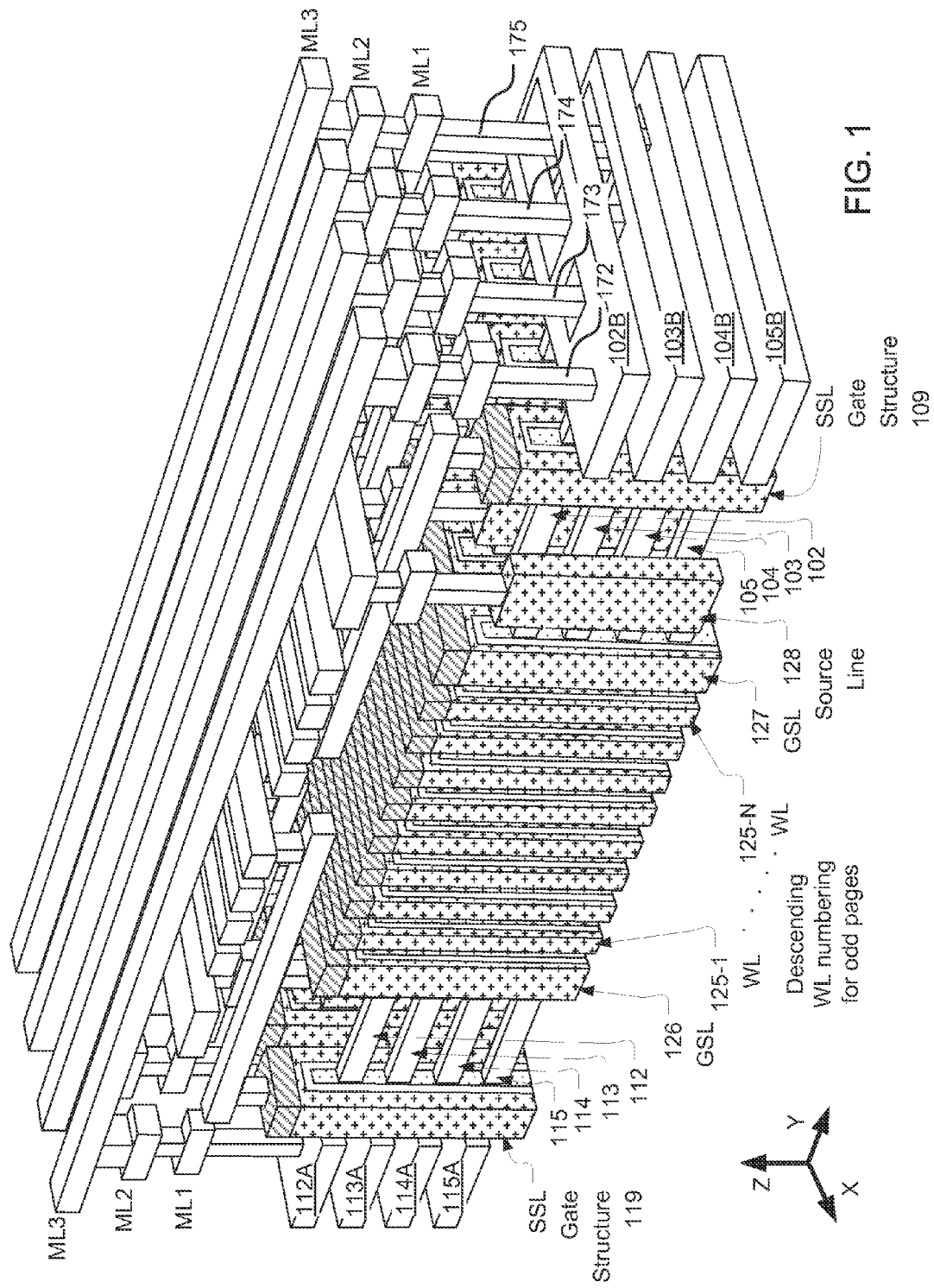
FIG. 1 is a perspective illustration of a three-dimensional (3D) NAND-flash memory device.

A detailed description of embodiments of the present invention is provided with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a perspective illustration of a three-dimensional (3D) NAND-flash memory device. The device illustrated in FIG. 1 includes stacks of active strips alternating with insulating strips. Insulating material is removed from the drawing to expose additional structure. For example, insulating strips are removed between the active strips in the stacks, and are removed between the stacks of active strips. This structure is described herein in some detail, as an example of a three-dimensional (3D) memory array which can be manufactured on a semiconductor substrate, in combination with peripheral circuits on the substrate (not shown). Other multilayer circuit structures can also be formed using the technology described herein.

In the example shown in FIG. 1, a multilayer array is formed on an insulating layer, and includes a plurality of word lines 125-1 WL through 125-N WL conformal with the plurality of stacks. The plurality of stacks includes active strips 112, 113, 114, and 115 in multiple planes. Active strips in the same plane are electrically coupled together by bit line structures (e.g. 102B).

Bit line structures 112A, 113A, 114A, and 115A terminate active strips, such as the active strips 112, 113, 114, and 115 in the plurality of stack. As illustrated, these bit line structures 112A, 113A, 114A, and 115A are electrically connected to different bit lines for connection to decoding circuitry to select planes within the array. These bit line structures 112A, 113A, 114A, and 115A can be patterned at the same time that the plurality of stacks is defined.

Bit line structures 102B, 103B, 104B, and 105B terminate active strips, such as active strips 102, 103, 104, and 105. As illustrated, interlayer connectors 172, 173, 174, 175 electrically connect bit line structures 102B, 103B, 104B, and 105B to different bit lines in metal layers, such as a metal layer ML3, for connection to decoding circuitry to select planes within the array. These bit line structures 102B, 103B, 104B, and 105B can be patterned at the same time that the plurality of stacks is defined.

Any given stack of active strips is coupled to either the bit line structures 112A, 113A, 114A, and 115A, or the bit line structures 102B, 103B, 104B, and 105B, but not both. A stack of semiconductor bit lines has one of the two opposite orientations of bit line end-to-source line end orientation, or source line end-to-bit line end orientation. For example, the stack of active strips 112, 113, 114, and 115 has bit line end-to-source line end orientation; and the stack of active strips 102, 103, 104, and 105 has source line end-to-bit line end orientation.

The stack of active strips 112, 113, 114, and 115 is terminated at one end by the bit line structures 112A, 113A, 114A, and 115A, passes through SSL gate structure 119, ground select line GSL 126, word lines 125-1 WL through 125-N WL, ground select line GSL 127, and is terminated at the other end by source line 128. The stack of active strips 112, 113, 114, and 115 does not reach the bit line structures 102B, 103B, 104B, and 105B.

The stack of active strips 102, 103, 104, and 105 is terminated at one end by the bit line structures 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of active strips 102, 103, 104, and 105 does not reach the bit line structures 112A, 113A, 114A, and 115A.

A layer of memory material is disposed in interface regions at cross-points between surfaces of the active strips 112-115 and 102-105 and the plurality of word lines 125-1 WL through 125-N WL. Ground select lines GSL 126 and GSL 127 are conformal with the plurality of stacks, similar to the word lines.

Every stack of active strips is terminated at one end by bit line structures and at the other end by a source line. For example, the stack of active strips 112, 113, 114, and 115 is terminated at one end by bit line structures 112A, 113A, 114A, and 115A, and terminated on the other end by a source line 128. At the near end of the figure, every other stack of active strips is terminated by the bit line structures 102B, 103B, 104B, and 105B, and every other stack of active strips is terminated by a separate source line. At the far end of the figure, every other stack of active strips is terminated by the bit line structures 112A, 113A, 114A, and 115A, and every other stack of active strips is terminated by a separate source line.

Bit lines and string select lines are formed at the metals layers ML1, ML2, and ML3. Bit lines are coupled to a plane decoder (not shown). String select lines are coupled to a string select line decoder (not shown).

The ground select lines GSL 126 and 127 can be patterned during the same step that the word lines 125-1 WL through 125-N WL are defined. Ground select devices are formed at cross-points between surfaces of the plurality of stacks and ground select lines GSL 126 and 127. The SSL gate structures 119 and 109 can be patterned during the same step in which the word lines 125-1 WL through 125-N WL are defined. String select devices are formed at cross-points between surfaces of the plurality of stacks and string select (SSL) gate structures 119 and 109. These devices are coupled to decoding circuitry for selecting the strings within particular stacks in the array.

In the example shown in FIG. 1, memory elements are formed in interface regions at cross-points between surfaces of the active strips 112-115 and 102-105 and the plurality of word lines 125-1 WL through 125-N WL. In operation, when voltage is applied to a gate structure of a memory element via one of the word lines, a channel region in a memory cell corresponding to the memory element beneath the gate structure is turned on. The technology described herein is directed to improving the performance of the channel region in a memory cell, which can improve the performance of thin film memory cells, such as those used in the 3D array of FIG. 1.

FIGS. 2-9 illustrate stages in a basic process flow for manufacturing a memory device like that of FIG. 1. In the process flow illustrated in FIGS. 2-9, a first plurality of stacks of active strips are defined between a first plurality of trenches, where each stack in the first plurality of stacks has a width greater than two times the target width or '2F'. A first memory layer is formed in the trenches and conductive lines that can act as word lines are defined over the first memory layer. Subsequently, the first plurality of stacks of active strips is etched to divide each stack in the first plurality of stacks into two stacks in a second plurality of stacks of active strips between a second plurality of trenches, where each stack in the second plurality of stacks has a width substantially equal to the target width or '1F'. A second memory layer is then formed in the second plurality of trenches and conductive lines that can act as word lines are defined over the second memory layer.

Figure 2:
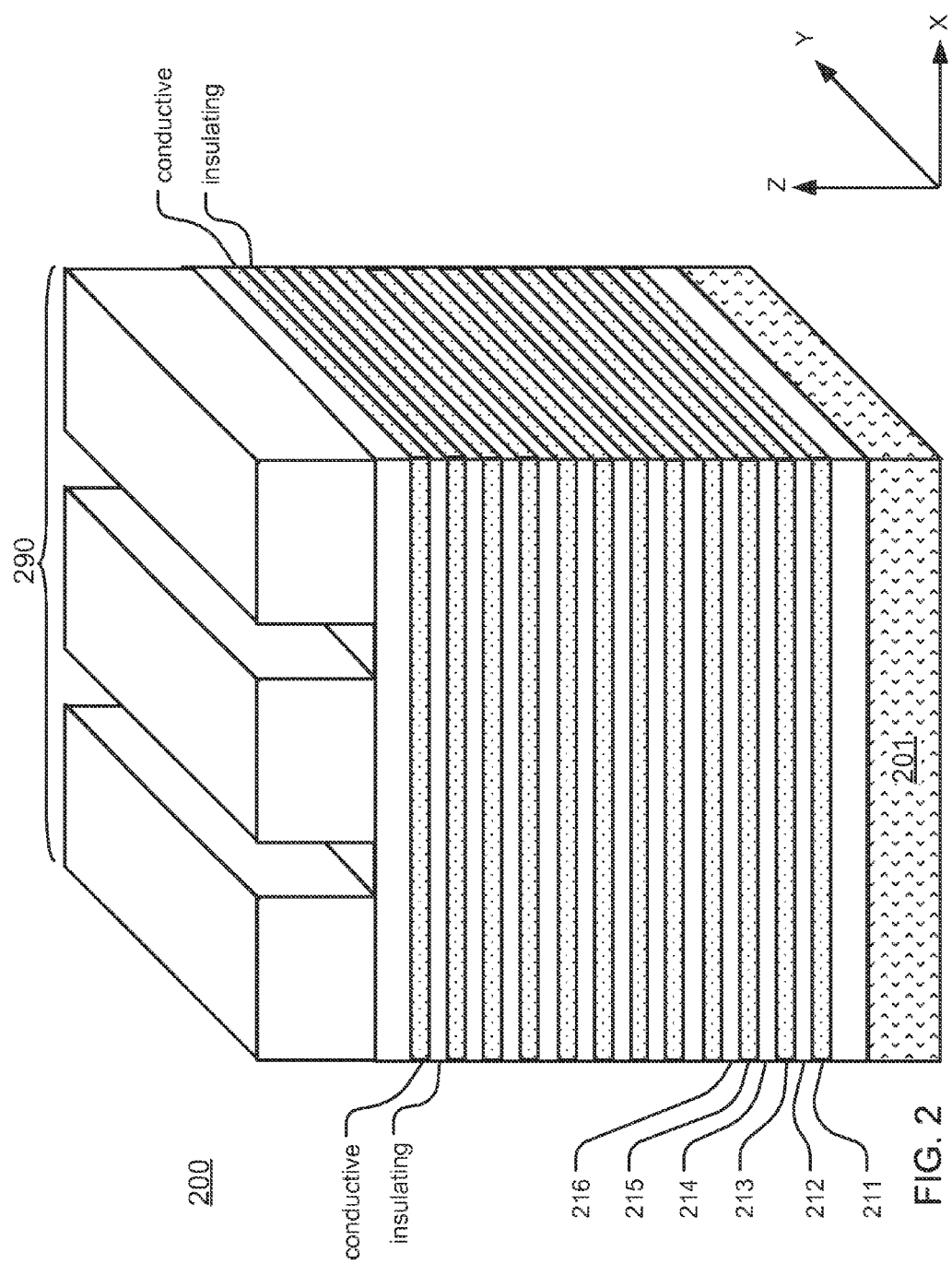
FIG. 2 illustrates a stage in a process for manufacturing a memory device like that of FIG. 1.

In FIG. 2, a structure 200 is shown including a plurality of semiconductor layers of a first conductive material (e.g. 211, 213, 215) alternating with insulating layers (e.g. 212, 214, 216) on an integrated circuit substrate (e.g. 201), resulting from alternating deposition of insulating layers and semiconductor layers. The semiconductor layers can be formed using doped semiconductors for example in a blanket deposition in an array area of a memory device. Depending on the implementation, the semiconductor layers (e.g. 211, 213, 215) can be implemented using polysilicon or epitaxial single crystal silicon having n-type or p-type doping. Inter-level insulating layers (e.g. 212, 214, 216) can be implemented for example using silicon dioxide, other silicon oxides, or silicon nitride. These layers can be formed in a variety of ways, including low pressure chemical vapor deposition LPCVD processes available in the art.

A first removable hard mask (e.g. 290), such as APF (Advanced Patterning Film), is formed over the plurality of semiconductor layers alternating with insulating layers for patterning a first plurality of stacks of active strips between a first plurality of trenches. The first removable hard mask has mask regions and spaced apart open etch regions corresponding to stacks of active strips in the first plurality of stacks of active strips and trenches in the first plurality of trenches, respectively.

Figure 3:
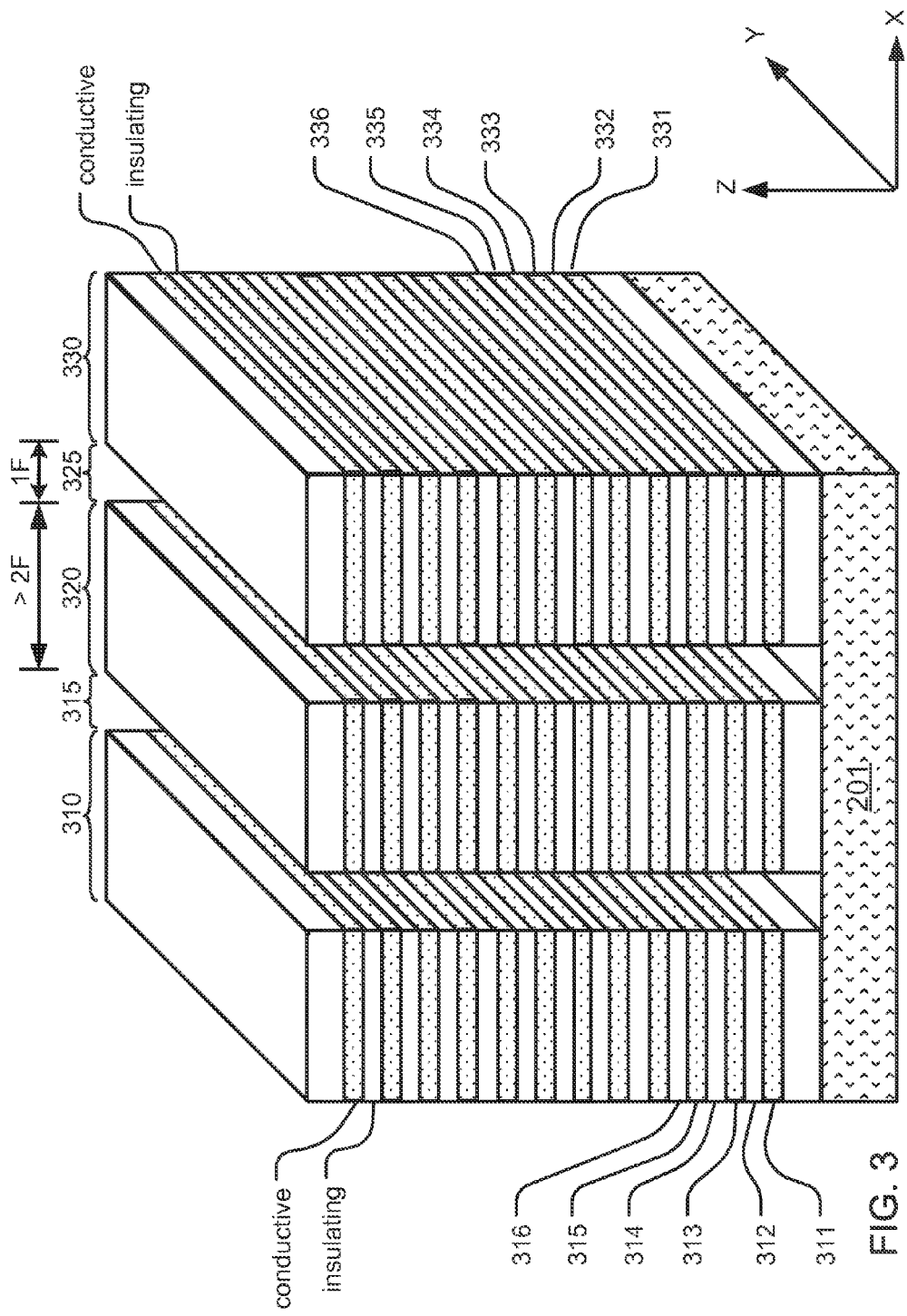
FIG. 3 illustrates a first etching stage in a process for manufacturing a memory device like that of FIG. 1.

FIG. 3 illustrates a first etching stage in a process for manufacturing a memory device like that of FIG. 1. The plurality of semiconductor layers is etched in a first lithographic patterning step, for example using the first removable hard mask (e.g. 290, FIG. 2) and reactive ion etching (RIE), to define a first plurality of stacks of active strips (e.g. 310, 320, 330) between a first plurality of trenches (e.g. 315, 325). For instance, a stack 310 can include active strips 311, 313 and 315 alternating with insulating strips 312, 314 and 316, and a stack 330 can includes active strips 331, 333 and 335 alternating with insulating strips 332, 334 and 336. The active strips can be implemented using the plurality of semiconductor layers. After the first plurality of stacks of active strips (e.g. 310, 320, 330) are defined, the removable hard mask (e.g. 290) is removed, for instance using O2/H2 plasma asher, stopping at an insulation layer below the removable hard mask. In semiconductor manufacturing, plasma ashing is a process of removing the photoresist or removable hard mask from an etched wafer. Using a plasma source, a monatomic reactive species is generated. Oxygen and hydrogen can be used as reactive species. The reactive species combines with the photoresist or removable hard mask to form ash which is then removed.

A stack in the first plurality of stacks can have a width greater than two times the target width or '2F'. As shown in the example of FIG. 3, stacks (e.g. 310, 320, 330) have a width greater than two times the target width or '2F'.

As stacks in memory devices include more layers of memory cells, trenches between the stacks are required to be deeper and have higher aspect ratios. However, the stacks between the trenches can have mechanical problems including bending and collapsing when the aspect ratios become higher. Stacks having a wider width such as '3F' are less likely to experience the bending or collapsing problems than stacks having a narrower width such as '1F'. By relaxing the width of stacks, for example from 1F to 3F, stacks in memory devices can be more reliably manufactured to support more layers of memory cells.

Figure 4:
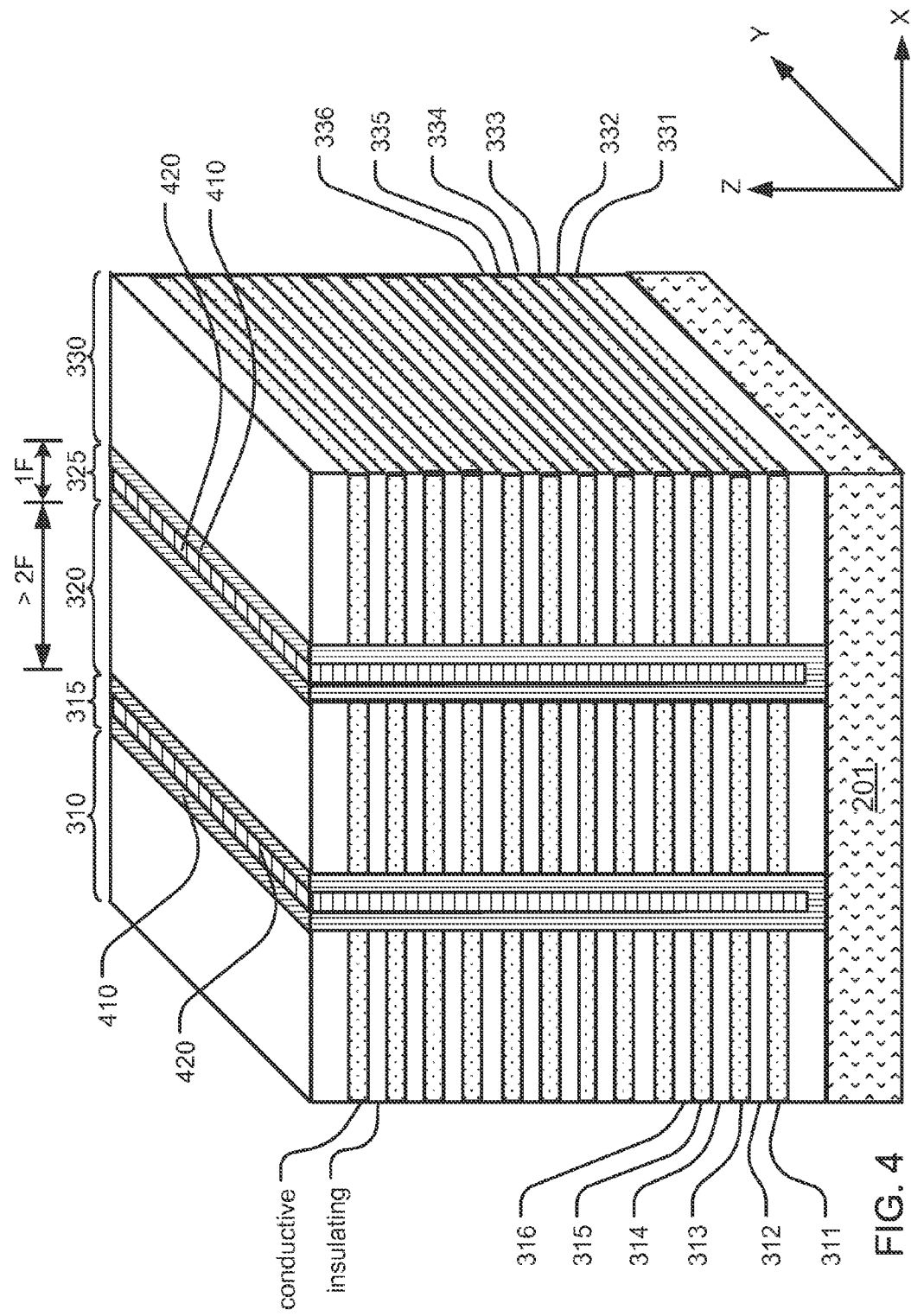
FIG. 4 illustrates a first filling stage in a process for manufacturing a memory device like that of FIG. 1.

FIG. 4 illustrates a first filling stage in a process for manufacturing a memory device like that of FIG. 1. FIG. 4 shows results of forming a first memory layer (e.g. 410) on side surfaces of active strips in the first plurality of stacks in the first plurality of trenches (e.g. 315, 325), and forming a first layer of a second conductive material (e.g. 420) over and having a surface conformal with the first memory layer (e.g. 410). The first memory layer is deposited in a conformal manner over the stacks in the first plurality of stacks of active strips. The first memory layer can be formed by blanket deposition of a memory material that can include charge storage structures.

Charge storage structures in the memory device can include multilayer dielectric charge trapping structures known from flash memory technologies as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

The first layer of a second conductive material can include high work function metal or polysilicon having n-type or p-type doping, and be used for conductive lines which act as word lines. The work function of a metal refers to the minimum thermodynamic work (i.e. energy) needed to remove an electron from the metal. The work function is a property of the surface of the metal. For instance, high work function metals can include chemical elements TiN, TaN, Pt, W, etc. High aspect ratio deposition technologies such as low-pressure chemical vapor deposition of polysilicon can be utilized to completely fill the trenches between the stacks, even very narrow trenches on the order of 10 nanometers wide with high aspect ratio.

Figure 5:
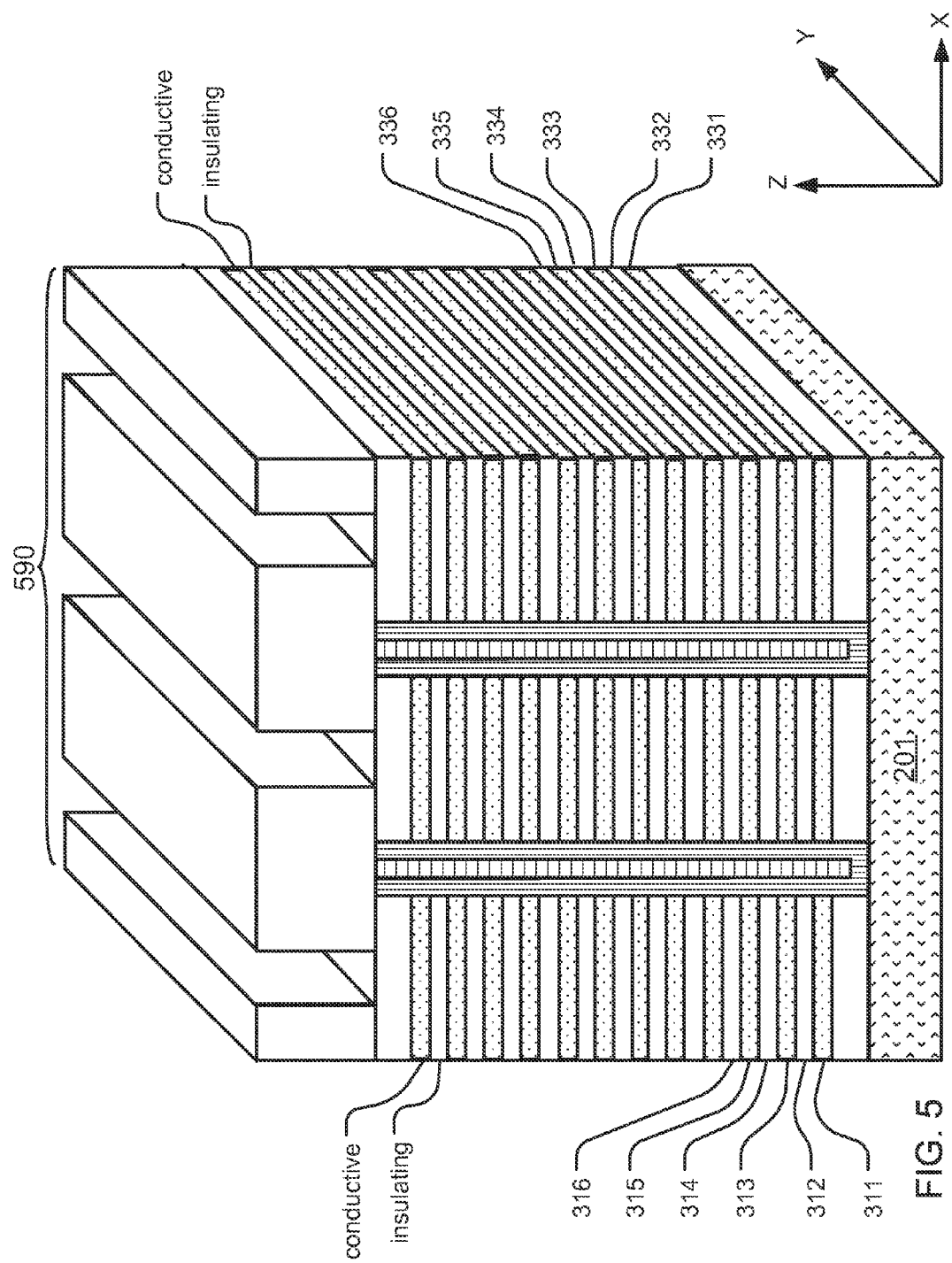
FIG. 5 illustrates a removable hard mask over the structure shown in FIG. 4.

FIG. 5 illustrates a second removable hard mask (e.g. 590), such as APF (Advanced Patterning Film), over the structure shown in FIG. 4. The second removable hard mask has mask regions and spaced apart open etch regions corresponding to stacks of active strips in a second plurality of stacks of active strips and trenches in a second plurality of trenches, respectively.

Figure 6:
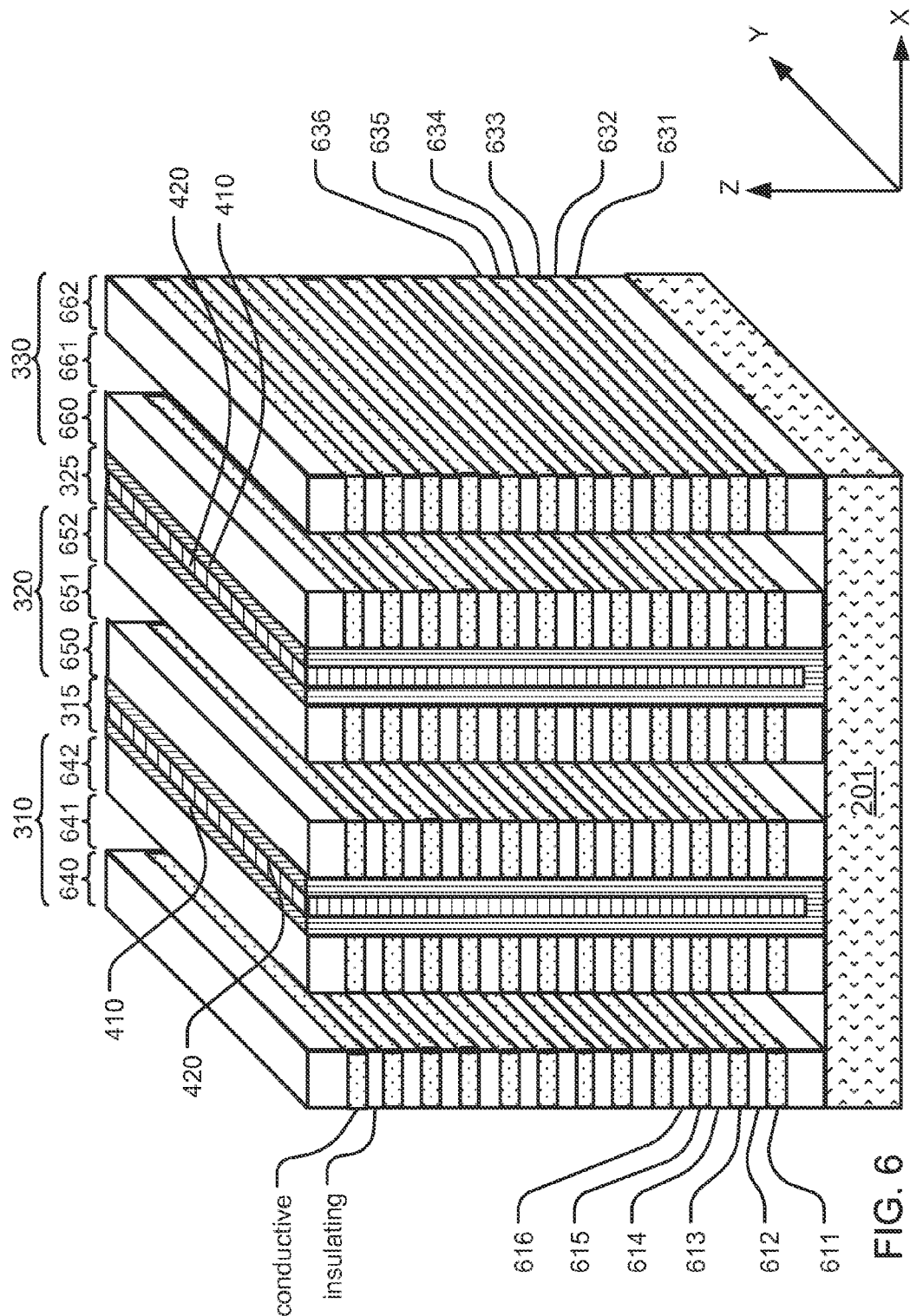
FIG. 6 illustrates a second etching stage in a process for manufacturing a memory device like that of FIG. 1.

FIG. 6 illustrates a second etching stage in a process for manufacturing a memory device like that of FIG. 1. After the first memory layer (e.g. 410) and the first layer of a second conductive material (e.g. 420) are formed in the first plurality of trenches (e.g. 315, 325), the first plurality of stacks is etched, for example using a second removable hard mask (e.g. 590, FIG. 5) and reactive ion etching (RIE), to define a second plurality of stacks of active strips (e.g. 640, 642, 650, 652, 660, 662) between a second plurality of trenches (e.g. 641, 651, 661). Each stack in the first plurality of stacks (e.g. 310) is divided into two stacks (e.g. 640, 642) in the second plurality of stacks of active strips. For instance, a stack 640 can include active strips 611, 613 and 615 alternating with insulating strips 612, 614 and 616, and a stack 662 can includes active strips 631, 633 and 635 alternating with insulating strips 632, 634 and 636. Each stack in the second plurality of stacks (e.g. 642) is defined between a first trench (e.g. 315) in the first plurality of trenches and a second trench (e.g. 641) in the second plurality of trenches. A stack in the second plurality of stacks has a width substantially equal to the target width or '1F'. After the second plurality of stacks of active strips (e.g. 640, 642, 650, 652, 660, 662) are defined, the removable hard mask (e.g. 590) is removed, for instance using O2/H2 plasma asher, stopping at an insulation layer below the removable hard mask.

Since trenches in the first plurality of trenches are filled with the first memory layer and the second conductive material before the second plurality of stacks of active strips is defined, two stacks in the second plurality of stacks (e.g. 642, 650) adjacent a trench in the first plurality of trenches (e.g. 315) that is filled with the first memory layer and the second conductive material is structurally stronger than two stacks adjacent a trench that is not filled. Consequently, higher aspect ratios can be utilized for etching the trenches, and more layers of memory cells in the stacks can be manufactured.

Figure 7:
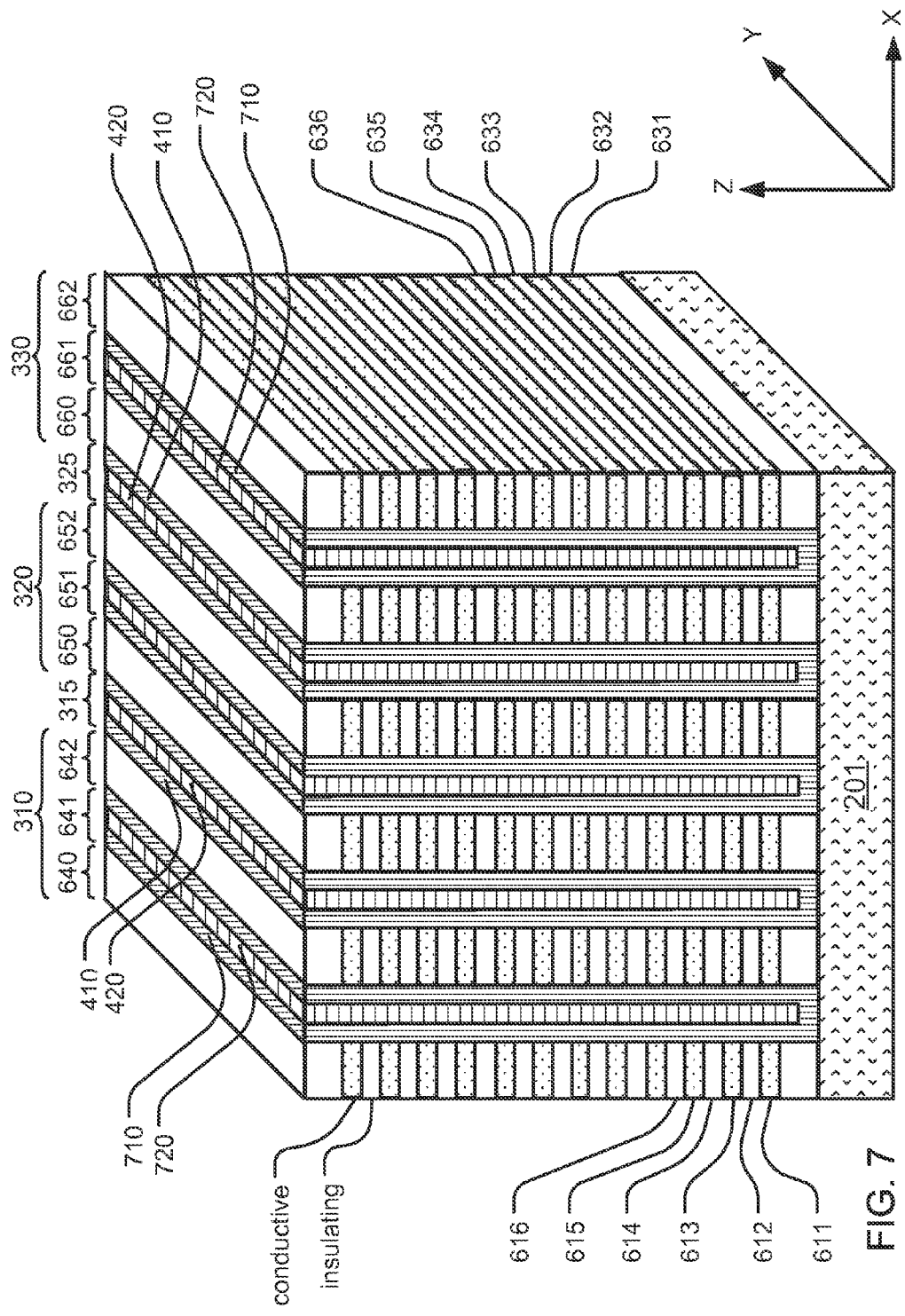
FIG. 7 illustrates a second filling stage in a process for manufacturing a memory device like that of FIG. 1.

FIG. 7 illustrates a second filling stage in a process for manufacturing a memory device like that of FIG. 1. FIG. 7 shows results of forming a second memory layer (e.g. 710) on side surfaces of active strips in the second plurality of stacks in the second plurality of trenches (e.g. 641, 651, 661), and forming a second layer of a second conductive material (e.g. 720) over and having a surface conformal with the second memory layer (e.g. 710). The second memory layer is deposited in a conformal manner over the stacks in the second plurality of stacks of active strips. The second memory layer (e.g. 710) can be formed by blanket deposition of the memory material that can include charge storage structures, as described for the first memory layer (e.g. 410, FIG. 4).

The second layer of a second conductive material can include high work function metal or polysilicon having n-type or p-type doping, and be used for conductive lines which act as word lines. High aspect ratio deposition technologies such as low-pressure chemical vapor deposition of polysilicon can be utilized to completely fill the trenches between the stacks.

Figure 8:
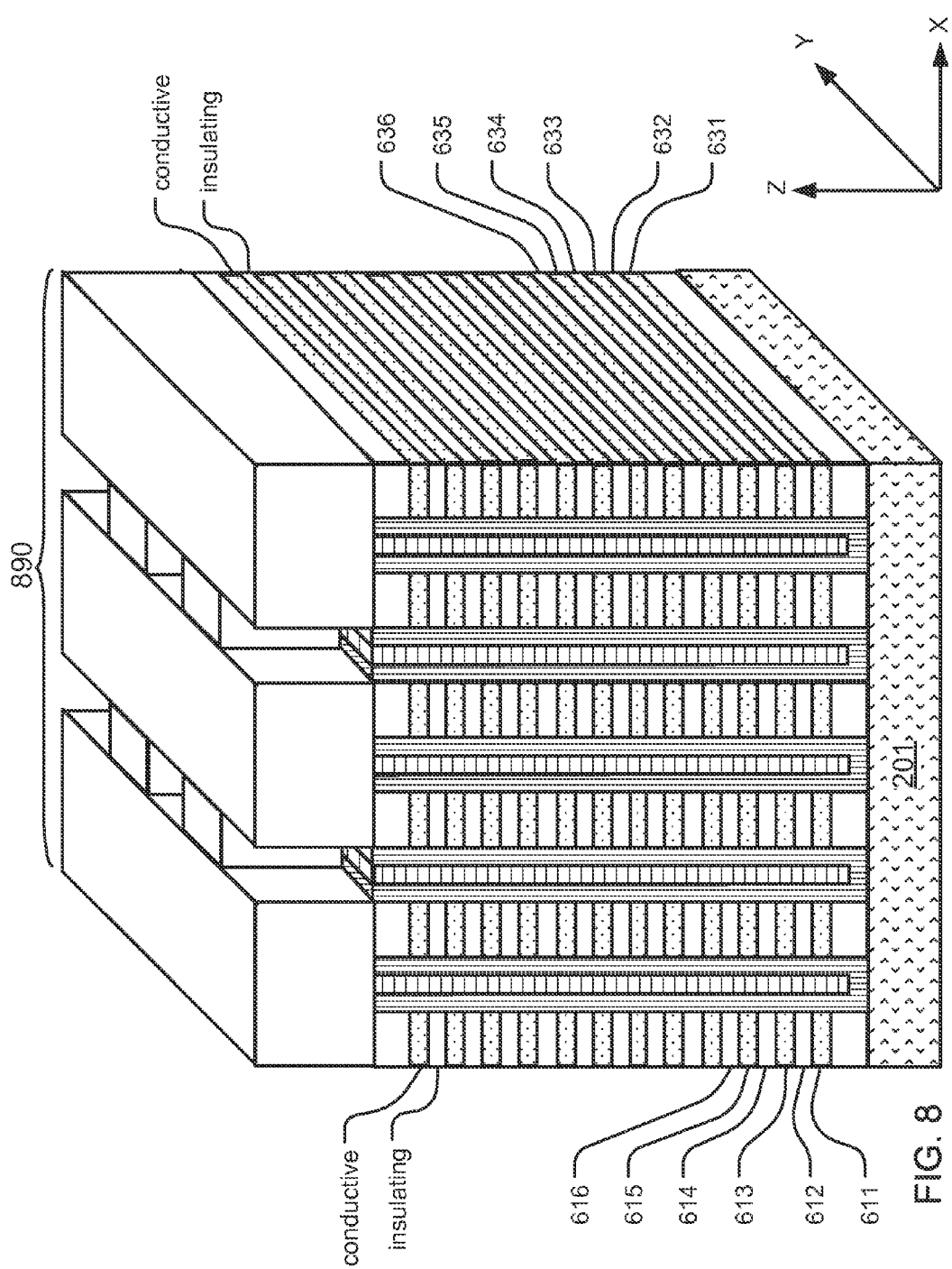
FIG. 8 illustrates a removable hard mask over the structure shown in FIG. 7.

FIG. 8 illustrates a third removable hard mask (e.g. 890) over the structure shown in FIG. 7. The third removable hard mask has mask regions and spaced apart open etch regions. The mask regions correspond to stacks of active strips in the second plurality of stacks, and a first plurality of conductive lines in the first plurality of trenches to be defined in the first plurality of trenches. The spaced apart open etch regions correspond to excess conductive material in the first layer of the second conductive material and excess memory material in the first memory layer to be removed.

Figure 9:
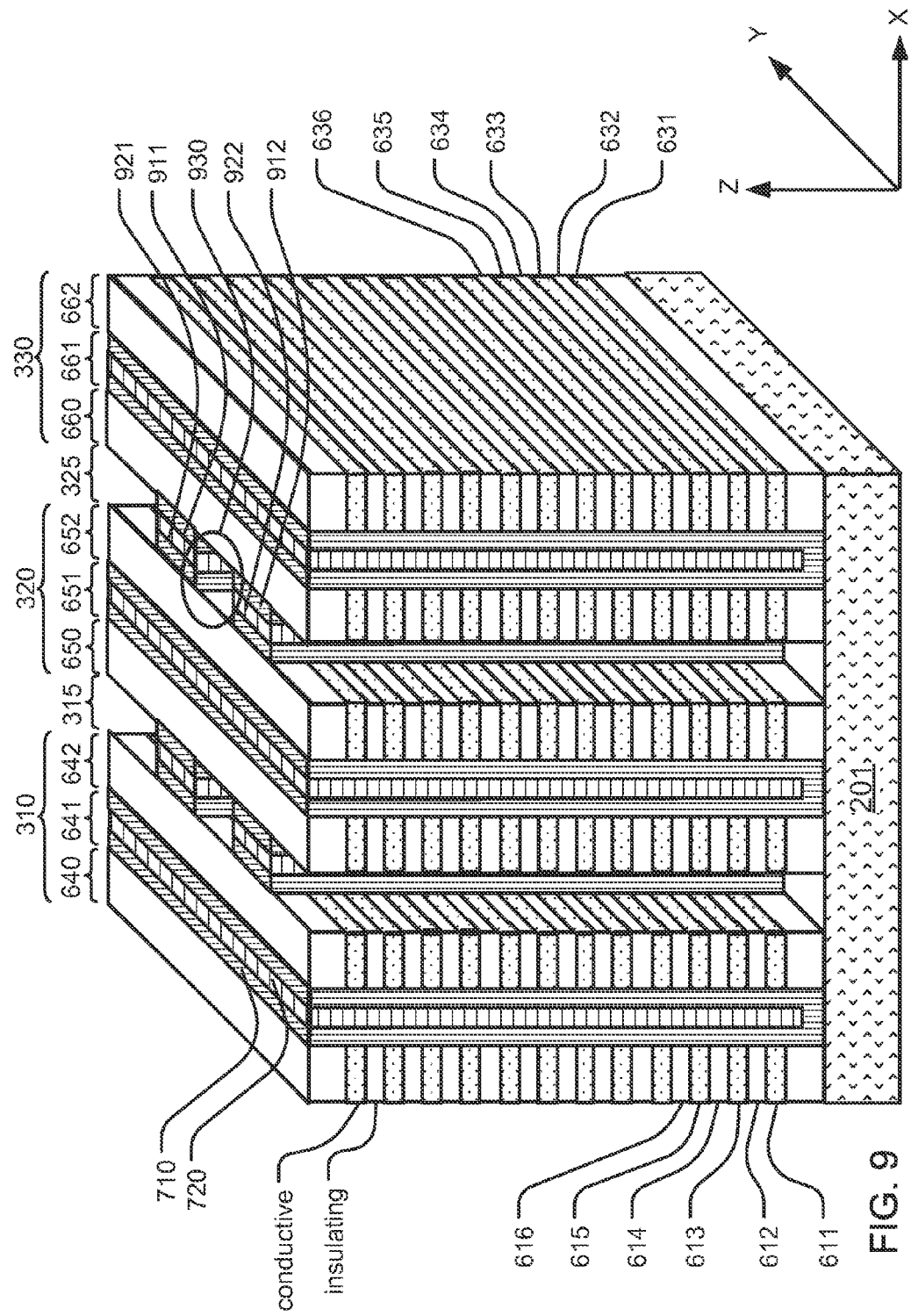
FIG. 9 illustrates a third etching stage to define a plurality of conductive lines in a first plurality of trenches.

FIG. 9 illustrates a third etching stage to define a plurality of conductive lines in the first plurality of trenches. The plurality of conductive lines can act as word lines for the memory device. The third etching stage can utilize the third removable hard mask (e.g. 890, FIG. 8) for etching high aspect ratio trenches between the conductive lines. Polysilicon can be etched using an etch process that is highly selective for polysilicon over silicon oxides or silicon nitrides. After the plurality of conductive lines in the first plurality of trenches are defined, the removable hard mask (e.g. 890) is removed, for instance using O2/H2 plasma asher, stopping at an insulation layer below the removable hard mask.

After the second memory layer (e.g. 710) is formed on side surfaces of active strips in the second plurality of stacks (e.g. 640, 642, 650, 652, 660, 662) in the second plurality of trenches (e.g. 641, 651, 661), and a second layer of the second conductive material (e.g. 720) is formed over and having a surface conformal with the second memory layer, the first layer of the second conductive material (e.g. 420, FIG. 4) is etched to define a first plurality of conductive lines (e.g. 921, 922) in the first plurality of trenches (e.g. 315, 325), arranged orthogonally over the active strips in the first plurality of stacks, and having surfaces conformal with the first memory layer (e.g. 410), defining memory cells in interface regions at cross-points between side surfaces of the active strips in the first plurality of stacks and the first plurality of conductive lines in the first plurality of trenches.

In one implementation, at the same time that the first layer of the second conductive material is etched to define a first plurality of conductive lines, the first memory layer is etched to define a first memory formation (e.g. 911, 912) in the first plurality of trenches. The first memory formation includes the memory material as described for the memory device, such as charge storage structures. The first memory formation is arranged orthogonally over the active strips in the first plurality of stacks, and having surfaces conformal with conductive lines in the first plurality of conductive lines. The first memory formation is disposed between side surfaces of the active strips in the first plurality of trenches and conductive lines in the first plurality of conductive lines. Excess conductive material in the first layer of the second conductive material and excess memory material in the first memory layer outside the interface regions and in the first plurality of trenches are removed.

The removal results in holes (e.g. 930) between stacks (e.g. 652, 660) in an X-direction, between conductive lines (e.g. 921, 922) and between first memory formations (e.g. 911, 912) in a Y-direction, in the first plurality of trenches. In a Z-direction, the holes are as deep as trenches in the first plurality of trenches. Consequently, adjacent conductive lines in the first plurality of conductive lines (e.g. 921, 922) and adjacent first memory formations (e.g. 911, 912) are separated by the holes (e.g. 930) in the first plurality of trenches.

Figure 10:
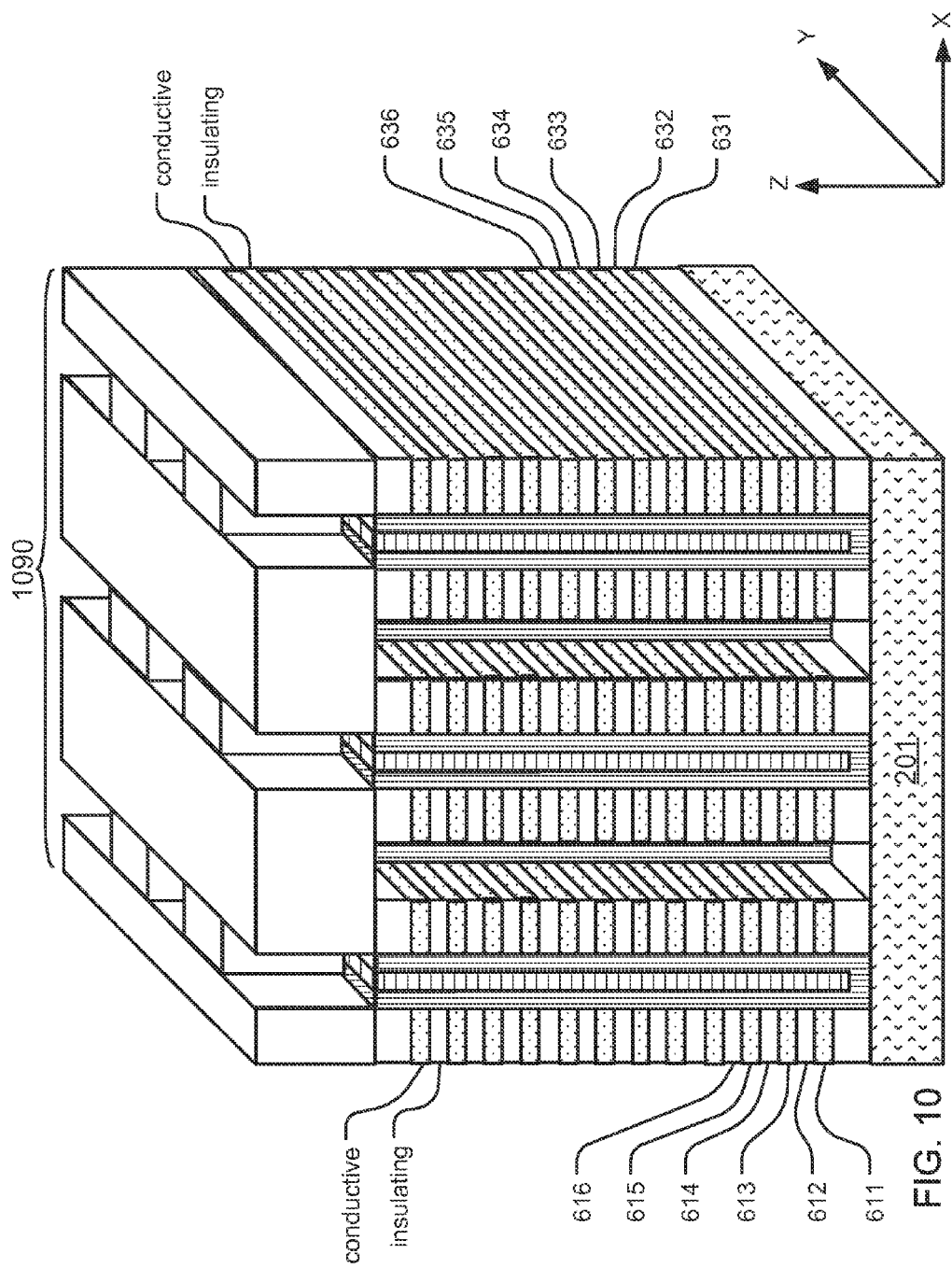
FIG. 10 illustrates a removable hard mask over the structure shown in FIG. 9.

FIG. 10 illustrates a fourth removable hard mask (e.g. 1090) over the structure shown in FIG. 9. The fourth removable hard mask has mask regions and spaced apart open etch regions. The mask regions correspond to stacks of active strips in the second plurality of stacks, the first plurality of trenches, and a second plurality of conductive lines in the second plurality of trenches to be defined in the second plurality of trenches. The spaced apart open etch regions correspond to excess conductive material in the second layer of the second conductive material and excess memory material in the second memory layer to be removed.

Figure 11:
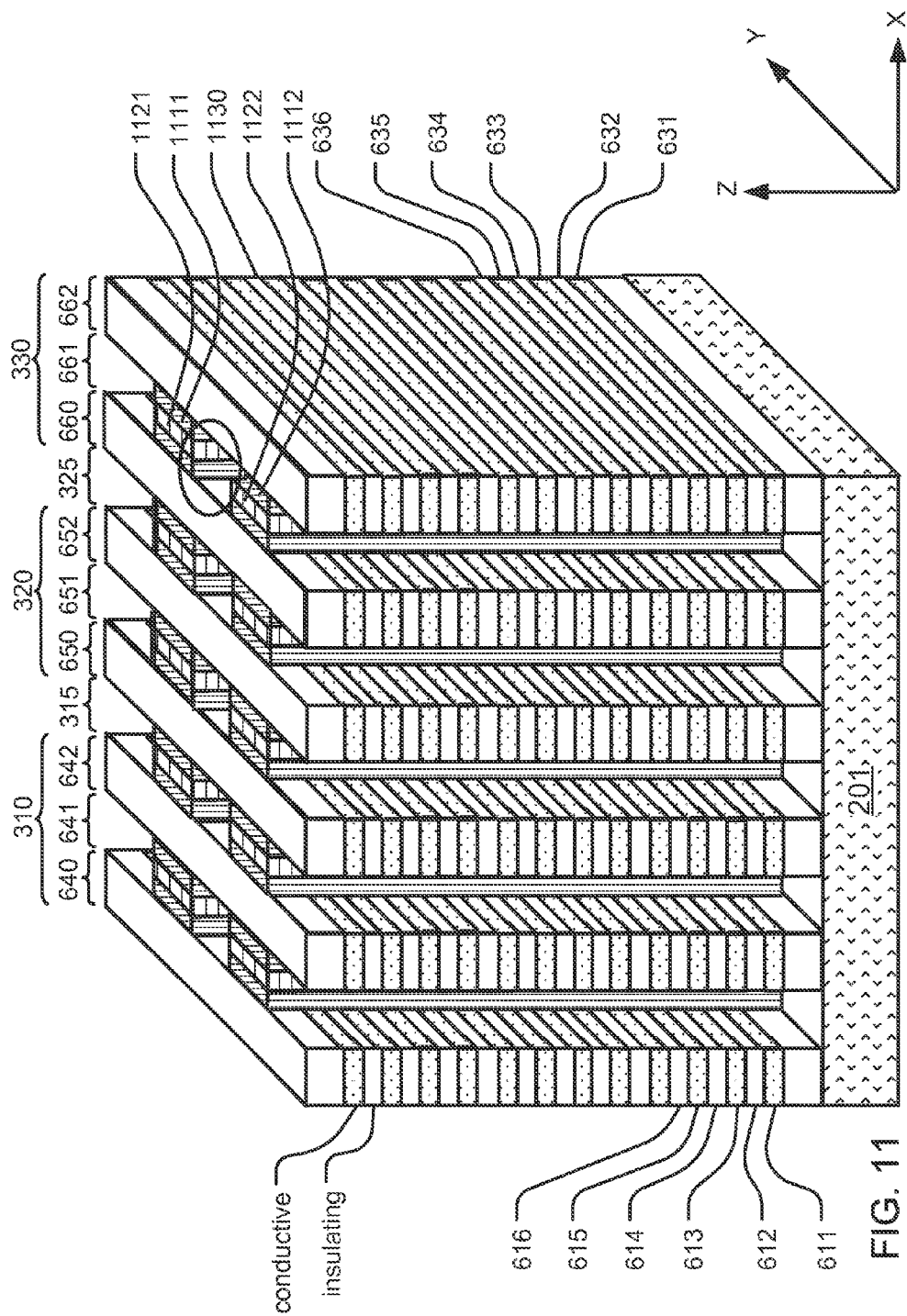
FIG. 11 illustrates a fourth etching stage to define a plurality of conductive lines in a second plurality of trenches.

FIG. 11 illustrates a fourth etching stage to define a plurality of conductive lines in the second plurality of trenches. The plurality of conductive lines can act as word lines for the memory device. The fourth etching stage can utilize a fourth removable hard mask (e.g. 1090, FIG. 10) for etching high aspect ratio trenches between the conductive lines. Polysilicon can be etched using an etch process that is highly selective for polysilicon over silicon oxides or silicon nitrides. After the plurality of conductive lines in the second plurality of trenches are defined, the removable hard mask (e.g. 1090) is removed, for instance using O2/H2 plasma asher, stopping at an insulation layer below the removable hard mask.

After the plurality of conductive lines (e.g. 921, 922, FIG. 9) is defined in the first plurality of trenches (e.g. 315, 325), the second layer of the second conductive material (e.g. 720) is etched to define a second plurality of conductive lines (e.g. 1121, 1122) in the second plurality of trenches (e.g. 641, 651, 661), arranged orthogonally over the active strips in the second plurality of stacks, and having surfaces conformal with the second memory layer (e.g. 710), defining memory cells in interface regions at cross-points between side surfaces of the active strips in the second plurality of the stacks and the second plurality of conductive lines in the second plurality of trenches.

In one implementation, at the same time that the second layer of the second conductive material is etched to define a second plurality of conductive lines, the second memory layer is etched to define a second memory formation (e.g. 1111, 1112) in the second plurality of trenches. The second memory formation includes the memory material as described for the memory device, such as charge storage structures. The second memory formation is arranged orthogonally over the active strips in the second plurality of stacks, and having surfaces conformal with conductive lines in the second plurality of conductive lines. The second memory formation is disposed between side surfaces of the active strips in the second plurality of trenches and conductive lines in the second plurality of conductive lines. Excess conductive material in the second layer of the second conductive material and excess memory material in the second memory layer outside the interface regions and in the second plurality of trenches are removed.

The removal results in holes (e.g. 1130) between stacks (e.g. 660, 662) in an X-direction, between conductive lines (e.g. 1121, 1122) and between second memory formations (e.g. 1111, 1112) in a Y-direction, in the first plurality of trenches. In a Z-direction, the holes are as deep as trenches in the first plurality of trenches. Consequently, adjacent conductive lines in the second plurality of conductive lines (e.g. 1121, 1122) and adjacent second memory formations (e.g. 1111, 1112) are separated by the holes (e.g. 1130) in the first plurality of trenches.

In an alternative implementation, the third etching stage as illustrated in FIG. 9 can be utilized to define a plurality of conductive lines in the second plurality of trenches, while the fourth etching stage as illustrated in FIG. 11 can be utilized to define the plurality of conductive lines in the first plurality of trenches. In another implementation, a single hard mask can be utilized to define a plurality of conductive lines in the first plurality of trenches and the second plurality of trenches, after the second filling stage as described in connection with FIG. 7.

Figure 12:
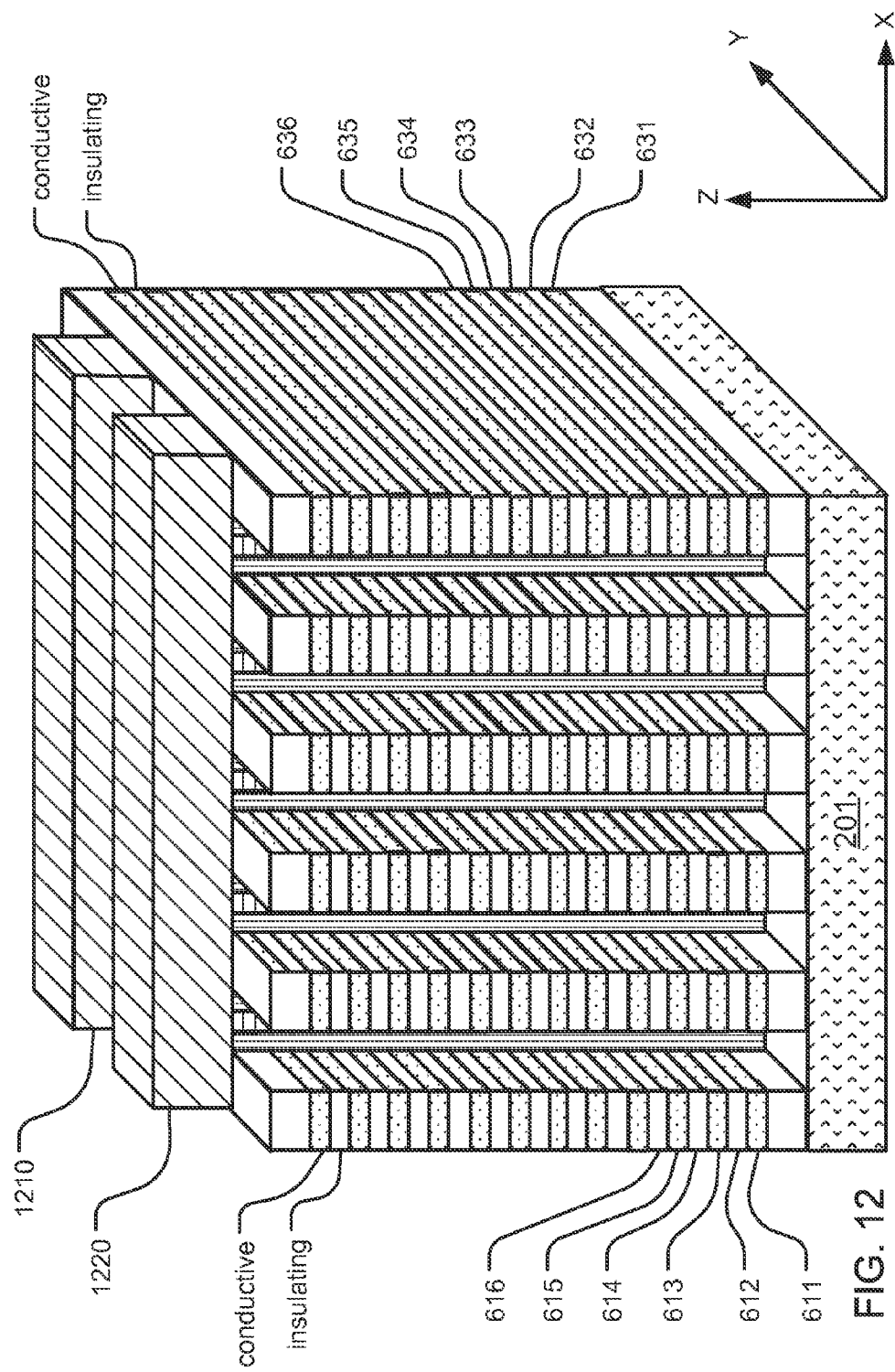
FIG. 12 illustrates horizontal conductive lines connecting word lines.

FIG. 12 illustrates horizontal conductive lines (e.g. 1210, 1220) connecting the plurality of conductive lines (e.g. 921, 922, FIG. 9) in the first plurality of trenches (e.g. 315, 325) and the plurality of conductive lines (e.g. 1121, 1122, FIG. 11) in the second plurality of trenches (e.g. 641, 651, 661), which act as word lines. The horizontal conductive lines can be polysilicon or metal lines, formed as result of an etch process that stops on top of the stacks of the structure shown in FIG. 11. The horizontal conductive lines can connect the word lines to a row decoder in the memory device (e.g. 1440, FIG. 14).

In the implementation described in connection with FIGS. 2-9, a first plurality of stacks of active strips are defined, where each stack in the first plurality of stacks has a width greater than two times the target width or '2F'. In an alternative implementation, each stack in the first plurality of stacks can have a width substantially equal to seven times the target width or '7F'.

In the alternative implementation, a first memory layer can then be formed in the trenches in the first plurality of trenches and conductive lines that can act as word lines are defined over the first memory layer. Subsequently, the first plurality of stacks of active strips is etched to divide each stack in the first plurality of stacks into two stacks in a second plurality of stacks of active strips between a second plurality of trenches, where each stack in the second plurality of stacks has a width greater than two times the target width or '2F'. A second memory layer is then formed in the second plurality of trenches and conductive lines that can act as word lines are defined over the second memory layer.

Finally, the second plurality of stacks of active strips is etched to divide each stack in the second plurality of stacks into two stacks in a third plurality of stacks of active strips between a third plurality of trenches, where each stack in the third plurality of stacks has a width substantially equal to the target width or '1F'. A third memory layer is then formed in the third plurality of trenches and conductive lines that can act as word lines are defined over the third memory layer.

Figure 13A:
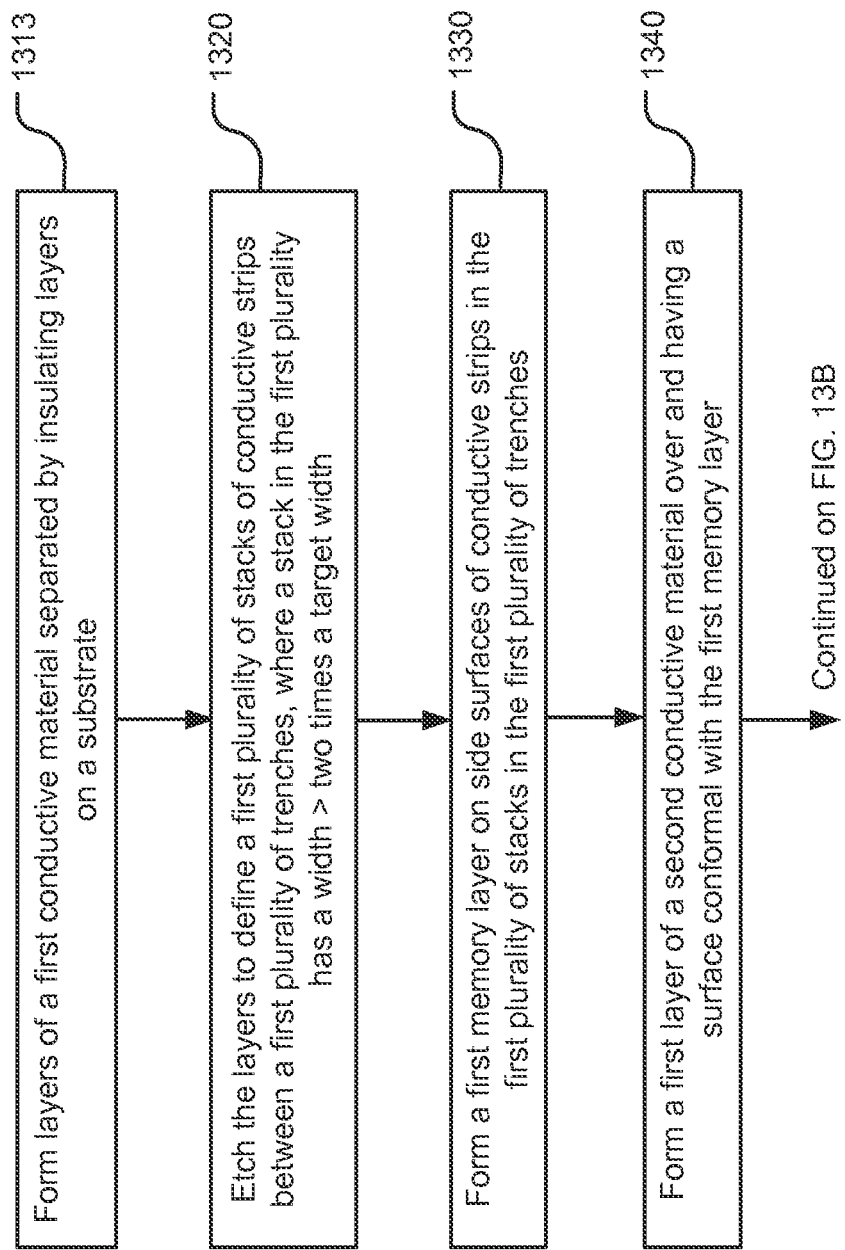
FIGS. 13A and 13B illustrate a simplified flowchart of an embodiment of a method for manufacturing a memory device.
Figure 13B:
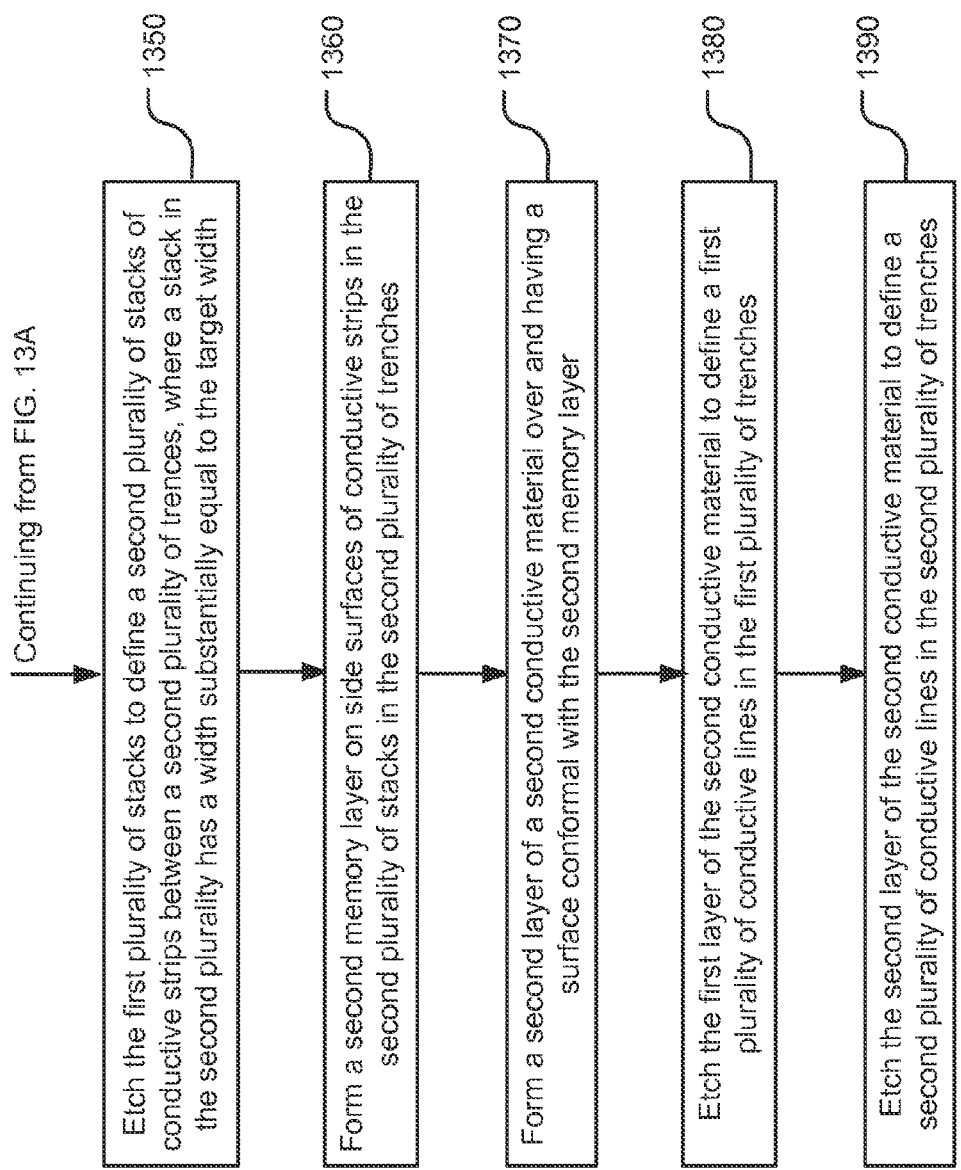

FIGS. 13A and 13B illustrate a simplified flowchart of an embodiment of a method for manufacturing a memory device. A plurality of semiconductor layers alternating with insulating layers is formed on an integrated circuit substrate (1310). The plurality of semiconductor layers is etched, for example using a first removable hard mask and reactive ion etching (RIE), to define a first plurality of stacks of active strips between a first plurality of trenches, where a stack in the first plurality of stacks has a width greater than two times the target width or '2F' (1320). After the first plurality of stacks is defined, a first memory layer is formed on side surfaces of active strips in the first plurality of stacks in the first plurality of trenches (1330), and then a first layer of a second conductive material is formed over and having a surface conformal with the first memory layer (1340).

After the first memory layer and the first layer of a second conductive material are formed in the first plurality of trenches, the first plurality of stacks is etched, for example using a second removable hard mask and reactive ion etching (RIE), to define a second plurality of stacks of active strips between a second plurality of trenches (1350). Each stack in the first plurality of stacks is divided into two stacks in the second plurality of stacks of active strips. Each stack in the second plurality of stacks is defined between a first trench in the first plurality of trenches and a second trench in the second plurality of trenches. A stack in the second plurality of stacks has a width substantially equal to the target width or '1F'.

After the second plurality of stacks is defined between the second plurality of trenches, a second memory layer is formed on side surfaces of active strips in the second plurality of stacks in the second plurality of trenches (1360), and then a second layer of the second conductive material is formed over and having a surface conformal with the second memory layer (1370).

After the second memory layer is formed on side surfaces of active strips in the second plurality of stacks in the second plurality of trenches, and the second layer of the second conductive material is formed over and having a surface conformal with the second memory layer, the first layer of the second conductive material is etched, for example using a third removable hard mask and reactive ion etching (RIE), to define a first plurality of conductive lines in the first plurality of trenches (1380). Conductive lines in the plurality of conductive lines in the first plurality of trenches are arranged orthogonally over the active strips in the first plurality of stacks, and having surfaces conformal with the first memory layer, defining memory cells in interface regions at cross-points between side surfaces of the active strips in the first plurality of stacks and the first plurality of conductive lines in the first plurality of trenches.

In one implementation, at the same time that the first layer of the second conductive material is etched to define a first plurality of conductive lines, the first memory layer is etched to define a first memory formation in the first plurality of trenches. The first memory formation is arranged orthogonally over the active strips in the first plurality of stacks, and having surfaces conformal with conductive lines in the first plurality of conductive lines. Excess conductive material in the first layer of the second conductive material and excess memory material in the first memory layer outside the interface regions and in the first plurality of trenches are removed.

After the plurality of conductive lines is defined in the first plurality of trenches, the second layer of the second conductive material is etched, for example using a fourth removable hard mask and reactive ion etching (RIE), to define a second plurality of conductive lines in the second plurality of trenches (1390). Conductive lines in the plurality of conductive lines in the second plurality of trenches are arranged orthogonally over, and having surfaces conformal with, the second memory layer, defining memory cells in interface regions at cross-points between side surfaces of the active strips in the second plurality of the stacks and the second plurality of conductive lines in the second plurality of trenches.

In one implementation, at the same time that the second layer of the second conductive material is etched to define a second plurality of conductive lines, the second memory layer is etched to define a second memory formation in the second plurality of trenches. The second memory formation is arranged orthogonally over the active strips in the second plurality of stacks, and having surfaces conformal with conductive lines in the second plurality of conductive lines. Excess conductive material in the second layer of the second conductive material and excess memory material in the second memory layer outside the interface regions and in the second.

Figure 14:
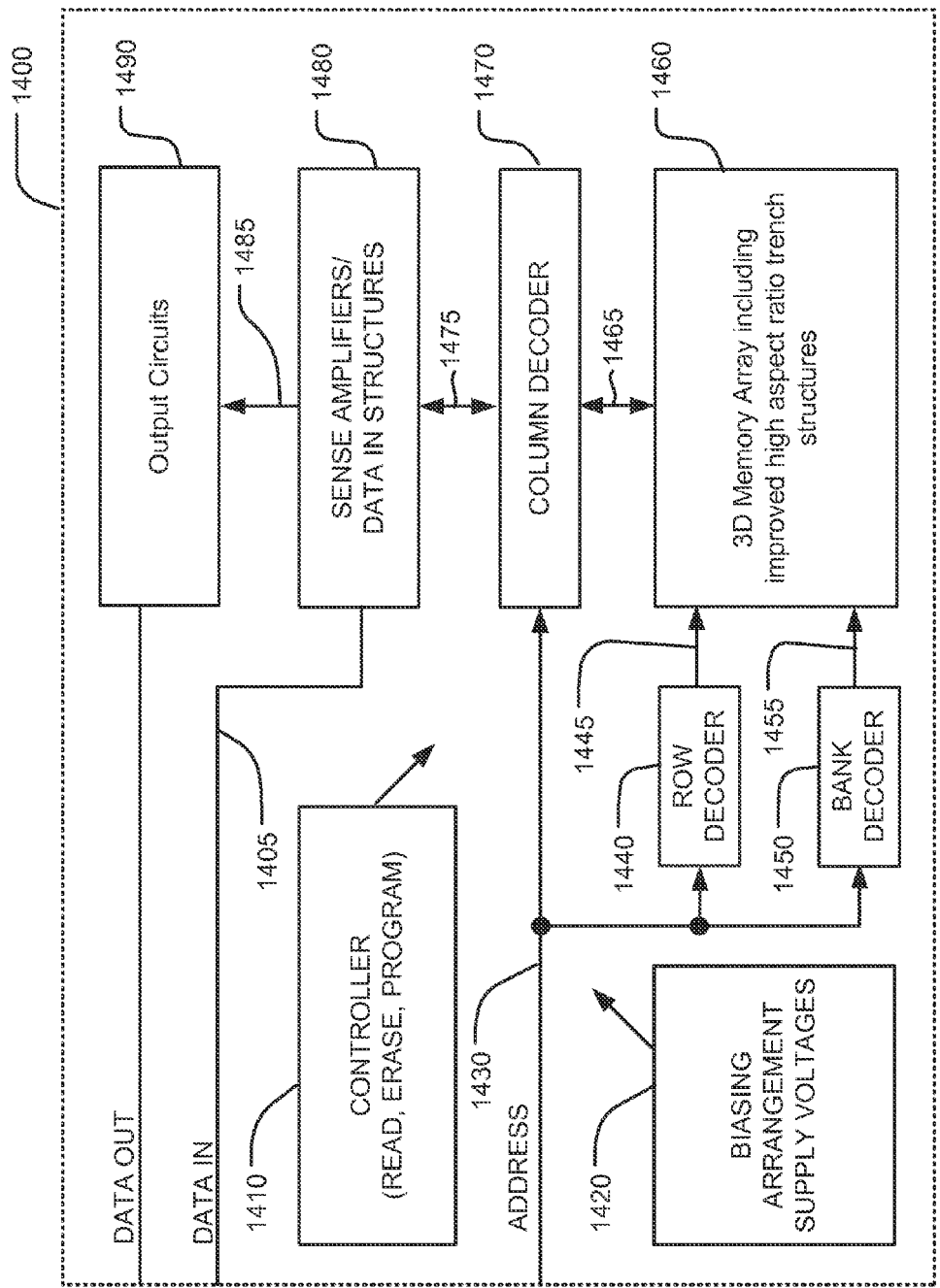
FIG. 14 is a simplified block diagram of an integrated circuit memory device according to an embodiment.

FIG. 14 is a simplified block diagram of an integrated circuit memory device according to an embodiment. The integrated circuit 1400 includes a 3D memory array 1460 on an integrated circuit substrate. The memory array 1460 includes improved high aspect ratio trench structures substantially as described herein.

A row decoder 1440 is coupled to a plurality of word lines 1445, and arranged along rows in the memory array 1460. A column decoder 1470 is coupled to a plurality of bit lines 1465 arranged along columns in the memory array 1460 for reading and programming data from the memory cells in the memory array 1460. A bank decoder 1450 is coupled to a plurality of banks in the memory array 1460 on bus 1455. Addresses are supplied on bus 1430 to column decoder 1470, row decoder 1440 and bank decoder 1450. Sense amplifiers and data-in structures in block 1480 are coupled to the column decoder 1470, in this example via data bus 1475. Sensed data from the sense amplifiers are supplied via output data lines 1485 to output circuits 1490. Output circuits 1490 drive the sensed data to destinations external to the integrated circuit 1400. Input data is supplied via the data-in line 1405 from input/output ports on the integrated circuit 1400 or from other data sources internal or external to the integrated circuit 1400, such as a general purpose processor or special purpose application circuitry, or a combination of modules providing system-on-a-chip functionality supported by the 3D memory array 1460, to the data-in structures in block 1480.

In the example shown in FIG. 14, a controller 1410 using a bias arrangement state machine controls the application of bias arrangement supply voltage generated or provided through the voltage supply or supplies in block 1420, such as read and program voltages. The controller 1410 can include modes of operation for multi-level cell (MLC) programming and reading. The controller 1410 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

The present technology can be applied to three-dimensional (3D) memory devices, including floating gate memories, charge trapping memories, and other non-volatile memories. The present technology can also be applied to any integrated circuits that utilize high aspect ratio etching in manufacturing.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a memory device, comprising:
   forming a plurality of semiconductor layers alternating with insulating layers on an integrated circuit substrate;
   etching the plurality of semiconductor layers to define a first plurality of stacks of active strips between a first plurality of trenches; and
   etching the first plurality of stacks to divide each stack in the first plurality of stacks into two stacks in a second plurality of stacks of active strips of the plurality of semiconductor layers, wherein each stack in the second plurality of stacks is defined between a first trench in the first plurality of trenches and a second trench in a second plurality of trenches;
   wherein channel regions of memory cells in the memory device are formed in active strips of the plurality of semiconductor layers in the second plurality of stacks.

2. The method of claim 1, further comprising:
   after the first plurality of stacks is defined and before the second plurality of stacks is defined,
   forming a first memory layer on side surfaces of active strips in the first plurality of stacks in the first plurality of trenches; and
   forming a first layer of conductive material over and having a surface conformal with the first memory layer.

3. The method of claim 1, further comprising:
forming a second memory layer on side surfaces of active strips in the second plurality of stacks in the second plurality of trenches; and
forming a second layer of conductive material over and having a surface conformal with the second memory layer.

4. The method of claim 1, comprising:
forming horizontal conductive lines connecting a first plurality of conductive lines in the first plurality of trenches and a second plurality of conductive lines in the second plurality of trenches to a row decoder in the memory device.

5. The method of claim 1, comprising:
forming bit line structures connecting active strips in the second plurality of stacks of active strips to a column decoder in the memory device.

6. The method of claim 1, comprising:
etching the second plurality of stacks to divide each stack in the second plurality of stacks into two stacks in a third plurality of stacks of active strips of the plurality of semiconductor layers, wherein the stack in the first plurality of stacks has a width substantially equal to seven times a width of a stack in the third plurality of stacks.

7. A method for manufacturing a memory device, comprising:
forming a plurality of semiconductor layers alternating with insulating layers on an integrated circuit substrate;
etching the plurality of semiconductor layers to define a first plurality of stacks of active strips between a first plurality of trenches;
etching the first plurality of stacks to divide each stack in the first plurality of stacks into two stacks in a second plurality of stacks of active strips of the plurality of semiconductor layers, wherein each stack in the second plurality of stacks is defined between a first trench in the first plurality of trenches and a second trench in a second plurality of trenches;
before the second plurality of stacks is defined, forming a first memory layer on side surfaces of active strips in the first plurality of stacks in the first plurality of trenches, and forming a first layer of conductive material over and having a surface conformal with the first memory layer; and
forming a second memory layer on side surfaces of active strips in the second plurality of stacks in the second plurality of trenches, and forming a second layer of conductive material over and having a surface conformal with the second memory layer.

8. The method of claim 7, further comprising:
after a second memory layer is formed on side surfaces of active strips in the second plurality of stacks in the second plurality of trenches, and a second layer of conductive material is formed over and having a surface conformal with the second memory layer,
etching the first layer of conductive material to define a first plurality of conductive lines in the first plurality of trenches, arranged orthogonally over the active strips in the first plurality of stacks, and having surfaces conformal with the first memory layer, defining memory cells in interface regions at cross-points between side surfaces of the active strips in the first plurality of stacks and the first plurality of conductive lines in the first plurality of trenches.

9. The method of claim 8, comprising:
etching the first memory layer to define a first memory formation in the first plurality of trenches, arranged orthogonally over the active strips in the first plurality of stacks, and having surfaces conformal with conductive lines in the first plurality of conductive lines.

10. The method of claim 8, comprising:
removing excess conductive material in the first layer of conductive material and excess memory material in the first memory layer outside the interface regions and in the first plurality of trenches.

11. The method of claim 7, further comprising:
after a plurality of conductive lines is defined in the first plurality of trenches, etching the second layer of conductive material to define a second plurality of conductive lines in the second plurality of trenches, arranged orthogonally over, and having surfaces conformal with, the second memory layer, defining memory cells in interface regions at cross-points between side surfaces of the active strips in the second plurality of stacks and the second plurality of conductive lines in the second plurality of trenches.

12. The method of claim 11, comprising:
etching the second memory layer to define a second memory formation in the second plurality of trenches, arranged orthogonally over the active strips in the second plurality of stacks, and having surfaces conformal with conductive lines in the second plurality of conductive lines.

13. The method of claim 11, comprising:
removing excess conductive material in the second layer of conductive material and excess memory material in the second memory layer outside the interface regions and in the second plurality of trenches.

14. The method of claim 7, further comprising:
after the first layer of conductive material is formed, and
after a second memory layer is formed on side surfaces of active strips in the second plurality of stacks in the second plurality of trenches, and a second layer of conductive material is formed over and having a surface conformal with the second memory layer,
etching the first layer and the second layer of conductive material, using a single hard mask, to define a plurality of conductive lines in the first plurality of trenches and the second plurality of trenches, arranged orthogonally over, and having surfaces conformal with, the first memory layer and the second memory layer, defining memory cells in interface regions at cross-points between side surfaces of the active strips in the first plurality and second plurality of stacks and the plurality of conductive lines.

15. The method of claim 14, comprising:
etching the first memory layer and the second memory layer to define a memory formation in the first plurality of trenches and the second plurality of trenches, arranged orthogonally over the active strips in the first plurality of stacks and the second plurality of stacks, and having surfaces conformal with conductive lines in the plurality of conductive lines.

16. The method of claim 14, comprising:
removing excess conductive material in the first layer of conductive material and excess memory material in the first memory layer outside the interface regions and in the first plurality of trenches; and
removing excess conductive material in the second layer of conductive material and excess memory material in the second memory layer outside the interface regions and in the second plurality of trenches.

* * * * *